United States Patent
Chen et al.

(10) Patent No.: US 9,438,262 B1
(45) Date of Patent: Sep. 6, 2016

(54) METHOD FOR TESTING DIFFERENTIAL ANALOG-TO-DIGITAL CONVERTER AND SYSTEM THEREFOR

(71) Applicant: FREESCALE SEMICONDUCTOR, INC., Austin, TX (US)

(72) Inventors: Tao Chen, Austin, TX (US); Douglas A. Garrity, Gilbert, AZ (US); Xiankun Jin, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/745,653

(22) Filed: Jun. 22, 2015

(51) Int. Cl.
 *H03M 1/10* (2006.01)
 *H03M 1/12* (2006.01)
 *H03H 19/00* (2006.01)

(52) U.S. Cl.
 CPC .............. *H03M 1/1095* (2013.01); *H03M 1/12* (2013.01); *H03H 19/004* (2013.01)

(58) Field of Classification Search
 None
 See application file for complete search history.

(56) References Cited

U.S. PATENT DOCUMENTS

| | | | |
|---|---|---|---|
| 5,049,831 A | 9/1991 | Westwick | |
| 5,220,286 A | 6/1993 | Nadeem | |
| 5,283,484 A * | 2/1994 | Brehmer | H03G 11/002 327/100 |
| 6,753,801 B2 * | 6/2004 | Rossi | H03F 3/005 341/161 |
| 7,129,734 B2 | 10/2006 | Geiger et al. | |
| 7,477,100 B2 | 1/2009 | Ranganathan et al. | |
| 7,852,252 B2 | 12/2010 | Ge et al. | |
| 7,868,795 B2 * | 1/2011 | Berens | H03M 1/002 341/120 |
| 8,089,302 B2 | 1/2012 | Louwsma et al. | |
| 8,198,937 B1 | 6/2012 | Vilas Boas et al. | |
| 8,344,798 B2 | 1/2013 | Garrity | |
| 8,400,339 B2 | 3/2013 | Garrity et al. | |
| 8,614,639 B1 * | 12/2013 | Yin | H03M 1/56 341/144 |
| 8,922,261 B2 | 12/2014 | Zhang et al. | |
| 9,319,033 B1 | 4/2016 | Jin et al. | |
| 2012/0038809 A1 | 2/2012 | Lee et al. | |
| 2014/0055176 A1 | 2/2014 | Zhang et al. | |

OTHER PUBLICATIONS

Jin et al "Low-cost high-quality constant offset injection for SEIR-based ADC built-in-self-test", IEEE International Symposium on Circuits and Systems (ISCAS), Jun. 1-5, 2014, pp. 285-288, Melbourne VIC.
Lacerda et al, "A Differential Switched-Capacitor Amplifier with Programmable Gain and Output Offset Voltage", Freescale Semiconductor, Inc., Eintell5342, 2006, 5 pages.
Provost et al, "On-Chip Ramp Generators for Mixed-Signal BIST and ADC Self-Test", IEEE Journal of Solid-State Circuits, Feb. 2003, pp. 263-273, vol. 38, Issue 2.
Duan et al, "Cost effective signal generators for ADC BIST", IEEE International Symposium on Circuits and Systems, May 24-27, 2009, pp. 13-16, Taipei.

\* cited by examiner

*Primary Examiner* — Howard Williams

(57) ABSTRACT

A method and circuit for testing an analog-to-digital converter (ADC) are provided. The method comprises: coupling a single-ended output of an analog signal source to a differential input of an amplifier; coupling a differential output of the amplifier to a differential input of the ADC; alternately providing first and second test signals from the single-ended output of the analog signal source to first and second input terminals of the differential input of the amplifier; amplifying the first and second test signals to generate amplified differential signals at the differential output of the amplifier; providing the amplified differential signals to the differential input of the ADC; and determining if an output of the ADC is as expected. An offset may also be provided to the differential output of the amplifier. The method allows an ADC having a differential input to be tested using a digital-to-analog converter (DAC) having a single-ended output.

20 Claims, 7 Drawing Sheets

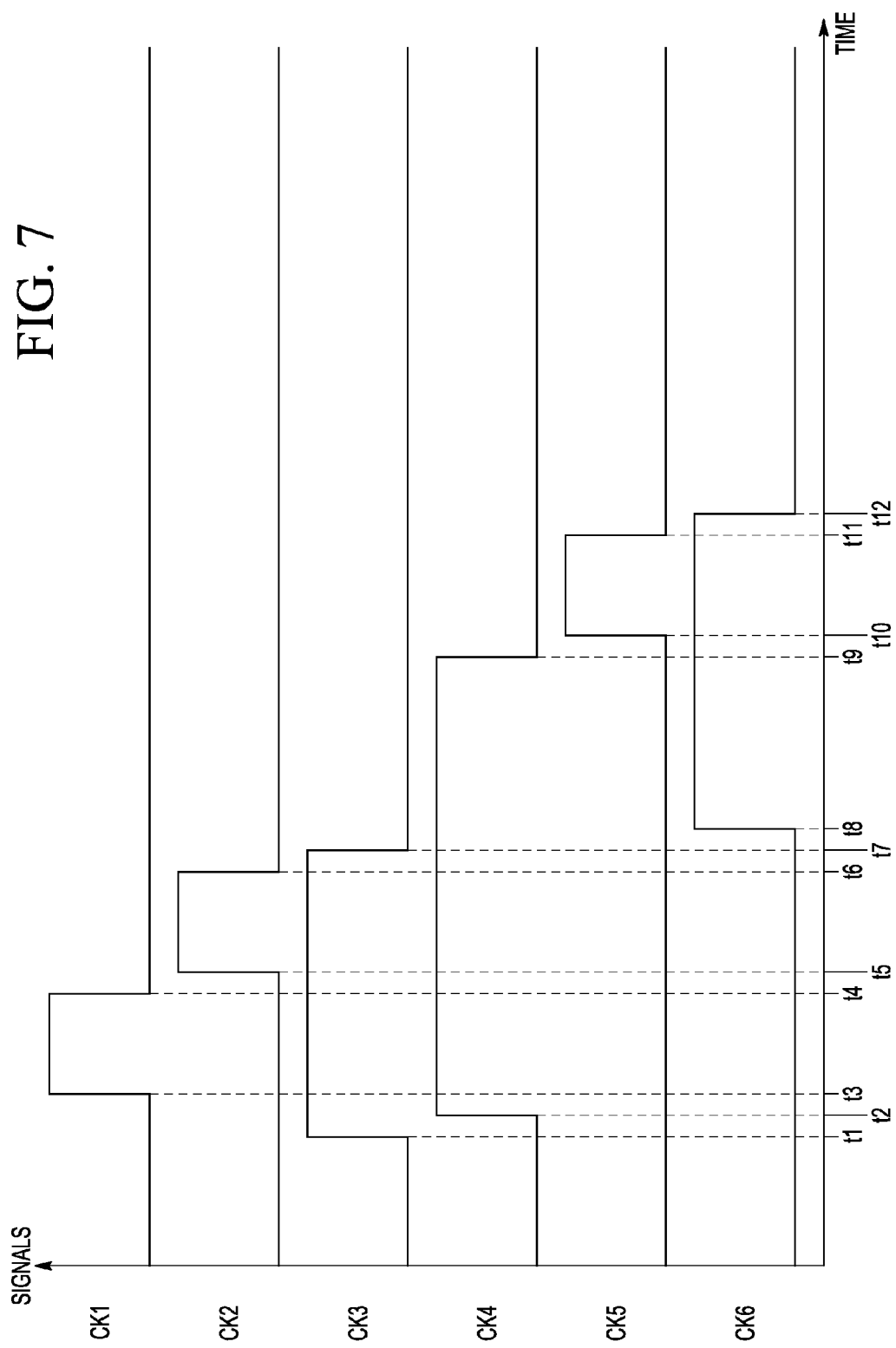

METHOD FOR TESTING DIFFERENTIAL ANALOG-TO-DIGITAL CONVERTER AND SYSTEM THEREFOR

BACKGROUND

1. Field

This disclosure relates generally to test methods and systems, and more specifically, to methods and systems for testing differential analog-to-digital converters.

2. Related Art

Many of today's system on chip (SoC) devices include converters such as an analog-to-digital converter (ADC). An ADC generally samples received analog voltages and converts the sampled voltages into digital codes. The resolution or precision of an ADC is typically dependent upon the application of SoCs. For example, if the ADC was used to determine a temperature in a consumer temperature sensing application, then a resolution of 8 bits might be required. Higher resolution ADCs require higher precision and are generally more sensitive to environmental conditions such as circuit noise, temperature, operating voltages, and so on. Traditionally, ADC testing is required in a factory setting to ensure functionality using sophisticated equipment. However, it is desirable to perform ADC testing within a system or application to assist in system debug efforts, for example.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 7 is a simplified timing diagram illustrating exemplary timing waveforms for switch control signals in FIGS. 2-6 according to an embodiment of the present disclosure.

DETAILED DESCRIPTION

The present disclosure describes a method and system which accommodates testing of a differential analog-to-digital converter (ADC) using a single ended output of an analog signal source such as a digital-to-analog converter (DAC), for example. When an SoC has an ADC and a DAC on-chip, the DAC can be used to provide test signals for the ADC, allowing ADC testing within a customer's system or application.

Figure 1:
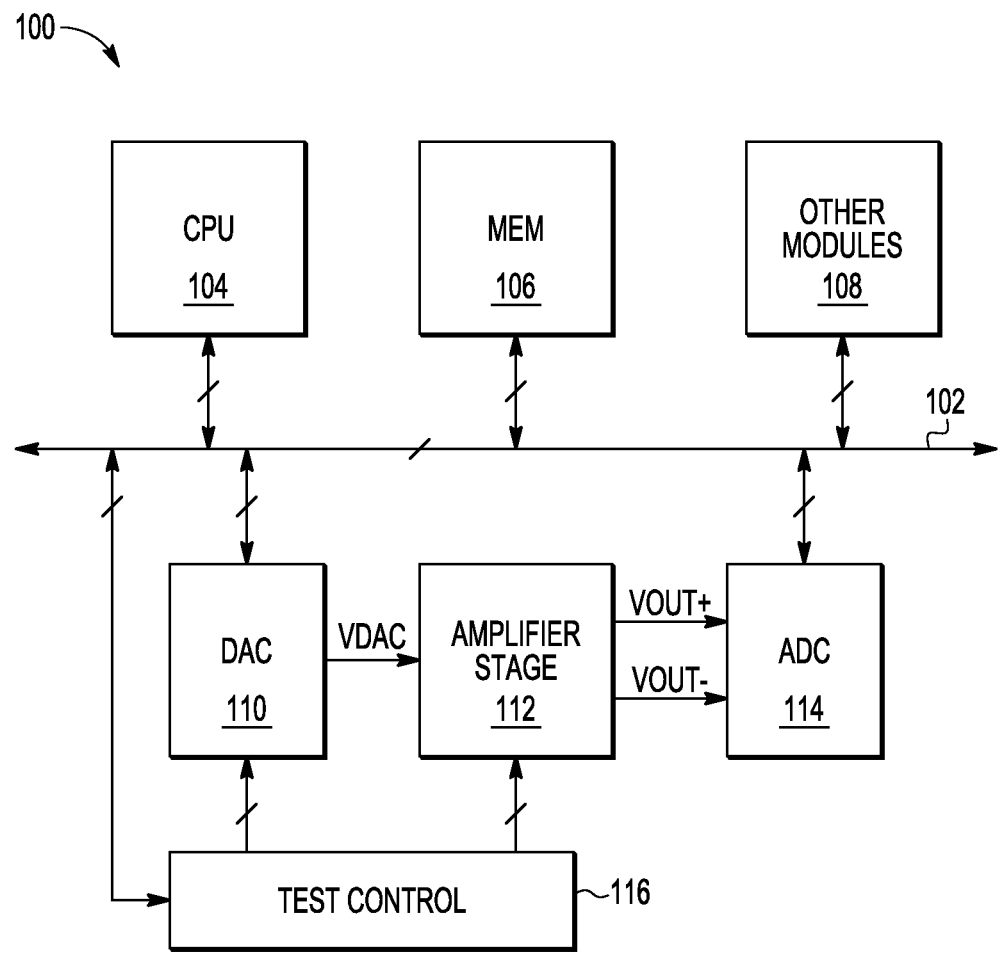
FIG. 1 is a simplified block diagram illustrating a processing system according to an embodiment of the present disclosure.

FIG. 1 is a simplified block diagram illustrating a processing system 100 according to an embodiment of the present disclosure. In some embodiments, processing system 100 may be implemented as a single integrated circuit. In some embodiments, processing system 100 may be implemented as a plurality of integrated circuits, or may be implemented as a combination of integrated circuits and discrete components. Alternate embodiments may implement system 100 in any manner.

In the embodiment illustrated in FIG. 1, processing system 100 includes a central processing unit (CPU) 104, memory 106, other modules 108, a digital-to-analog converter (DAC) 110, an analog-to-digital converter (ADC) 114, and a test control unit 116, which are all bi-directionally coupled to each other by way of a system bus 102. An amplifier stage 112 is coupled between DAC 110 and ADC 114. The amplifier stage 112 receives a single-ended output voltage VDAC from DAC 110 and provides differential output voltages VOUT+ and VOUT− respectively. The test control unit 116 provides signals to the DAC 110 and to the amplifier stage 112. In some embodiments, system 100 may include fewer, more, or different blocks of circuitry than those illustrated in FIG. 1.

In a test mode, test control unit 116 provides test codes or commands to the DAC 110. The DAC 110 in turn outputs analog voltages VDAC based on the test codes or commands. The VDAC voltages can be characterized as test signals and are alternately provided to differential inputs of a differential amplifier in the amplifier stage 112. In some embodiments, the test control unit 116 can provide a series of test codes or commands such that a ramped voltage is provided to the differential inputs of the differential amplifier in the amplifier stage 112. The differential amplifier amplifies the test signals generating amplified differential signals VOUT+ and VOUT− at differential outputs of the amplifier. The amplified differential signals are provided to differential inputs of the ADC 114. The ADC 114 in turn samples the amplified differential signals and generates at an output digital codes corresponding to the amplified differential signals. The generated digital codes are used to determine if the output of the ADC 114 is as expected. For example, the generated digital codes may be used to determine if the integral non-linearity, differential non-linearity, offset error, and a gain error of the output of the ADC 114 is within a predetermined criteria.

FIGS. 2-6 are simplified schematic diagrams illustrating an exemplary amplifier stage circuit at different phases of operation according to an embodiment of the present disclosure. FIG. 7 is a simplified timing diagram illustrating exemplary timing waveforms for switch control signals shown in the following FIGS. 2-6. Clock pulses on switch control signals CK1-CK6 have logic level high portions of the signal indicated by timing markers t1- t12.

Figure 2:
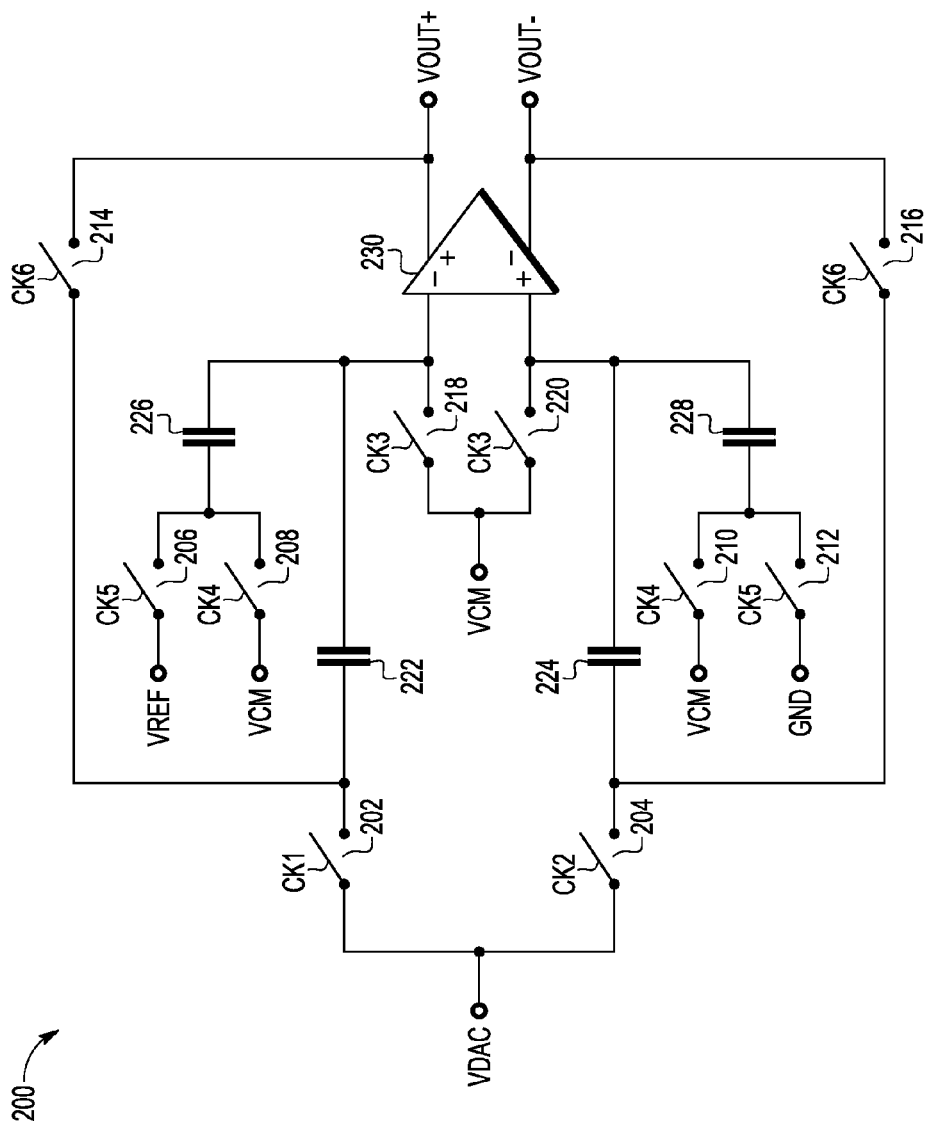
FIGS. 2-6 are simplified schematic diagrams illustrating an exemplary amplifier stage circuit at different phases of operation according to an embodiment of the present disclosure.

Amplifier stage 200 in FIG. 2 depicts representative circuitry of amplifier stage 112 shown in FIG. 1 and includes a plurality of switches 202-220, a plurality of capacitors 222-228, and a differential amplifier 230. Switches 202-220 in FIG. 2 are shown as open or non-conducting, corresponding to the exemplary timing waveforms for switch control signals CK1-CK6 prior to t1 in FIG. 7. In some embodiments, differential amplifier 230 is characterized as a differential operational amplifier with high open-loop gain. In some embodiments, differential amplifier 230 is characterized as a unity gain differential operational amplifier. Amplifier stage 200 provides at differential output terminals VOUT+ and VOUT− differential output voltages VOUT+ and VOUT− corresponding to the voltage VDAC (from DAC 110 in FIG. 1) received at an input terminal VDAC.

Each of capacitors 222-228 includes a first terminal and a second terminal whereby each of capacitors 222-228 may be coupled to other circuit elements of amplifier stage 200. Capacitors 222-228 can be formed with any suitable materials and structures available in a given process technology such as metal-oxide-semiconductor (MOS) capacitors, metal-insulator-metal (MIM) capacitors, polysilicon-insulator-polysilicon (PIP) capacitors, deep trench capacitors, and the like, for example. Capacitors 222-228 may be formed as a combination of the above capacitor types. For example, each capacitor 220-228 may be formed as a MOS capacitor in parallel or in series with a MIM capacitor.

Each of switches 202-220 includes a control terminal, and a first terminal and a second terminal whereby each of switches 202-220 may be coupled to other circuit elements of amplifier stage 200. Each control terminal of switches 202-220 is coupled to one of a set of switch control signals CK1-CK6. Each switch control signal may be in the form of a clock or clock pulse. Switches 202-220 can be formed with any suitable transistors, circuit elements, or combinations thereof. For example, switches 202-220 may be formed with an N-channel MOS (NMOS) transistor or a P-channel MOS (PMOS) transistor, or formed with a combination such as an NMOS transistor coupled in parallel with a PMOS transistor.

Transistors, as discussed herein, may include a control electrode, a first current electrode, and a second current electrode. For example, if a switch is formed with a transistor, the control terminal of the switch can be characterized as the control electrode of the transistor, and the first and second terminals of the switch can be characterized as the first and second current electrodes, respectively.

In this embodiment, a first switch 202 is coupled between the VDAC input terminal of amplifier stage 200 and a first terminal of capacitor 222. The control terminal of switch 202 is coupled to receive a first switch control signal CK1. A second switch 204 is coupled between the VDAC input terminal and a first terminal of capacitor 224. The control terminal of switch 202 is coupled to receive a second switch control signal CK2. The second terminal of capacitor 222 is coupled to a first input of differential amplifier 230 and the second terminal of capacitor 224 is coupled to a second input of differential amplifier 230. A first output of differential amplifier 230 is coupled to the VOUT+ differential output terminal of amplifier stage 200 and a second output of differential amplifier 230 is coupled to the VOUT− differential output terminal.

A third switch 206 is coupled between a reference voltage (VREF) supply terminal and a first terminal of capacitor 226. The VREF voltage at the VREF supply terminal may be at a value similar to VDD or the operating voltage of the ADC. The VREF supply may be a clean or noise-free version of VDD. The control terminal of switch 206 is coupled to receive a third switch control signal CK5. A fourth switch 208 is coupled between a common mode voltage (VCM) supply terminal and the first terminal of capacitor 226. In some embodiments, the VCM supply may be at half of the value of VREF. For example, if VREF is at 3.0 volts, then VCM may be 1.5 volts. The control terminal of switch 208 is coupled to receive a fourth switch control signal CK4. A fifth switch 210 is coupled between the VCM supply terminal and a first terminal of capacitor 228. The control terminal of switch 210 is coupled to receive the fourth switch control signal CK4. A sixth switch 212 is coupled between a ground voltage (GND) supply terminal and the first terminal of capacitor 228. The control terminal of switch 212 is coupled to receive switch control signal CK5. The second terminal of capacitor 226 is coupled to the first input of differential amplifier 230 and the second terminal of capacitor 228 is coupled to the second input of differential amplifier 230.

A seventh switch 214 is coupled between the first terminal of capacitor 222 and the VOUT+ differential output terminal. An eighth switch 216 is coupled between the first terminal of capacitor 224 and the VOUT− differential output terminal. The control terminal of switch 214 and the control terminal of switch 216 are each coupled to receive a fifth switch control signal CK6. A ninth switch 218 is coupled between the VCM supply terminal and the first input of differential amplifier 230. A tenth switch 220 is coupled between the VCM supply terminal and the second input of differential amplifier 230. The control terminal of switch 218 and the control terminal of switch 220 are each coupled to receive a sixth switch control signal CK3.

Figure 3:
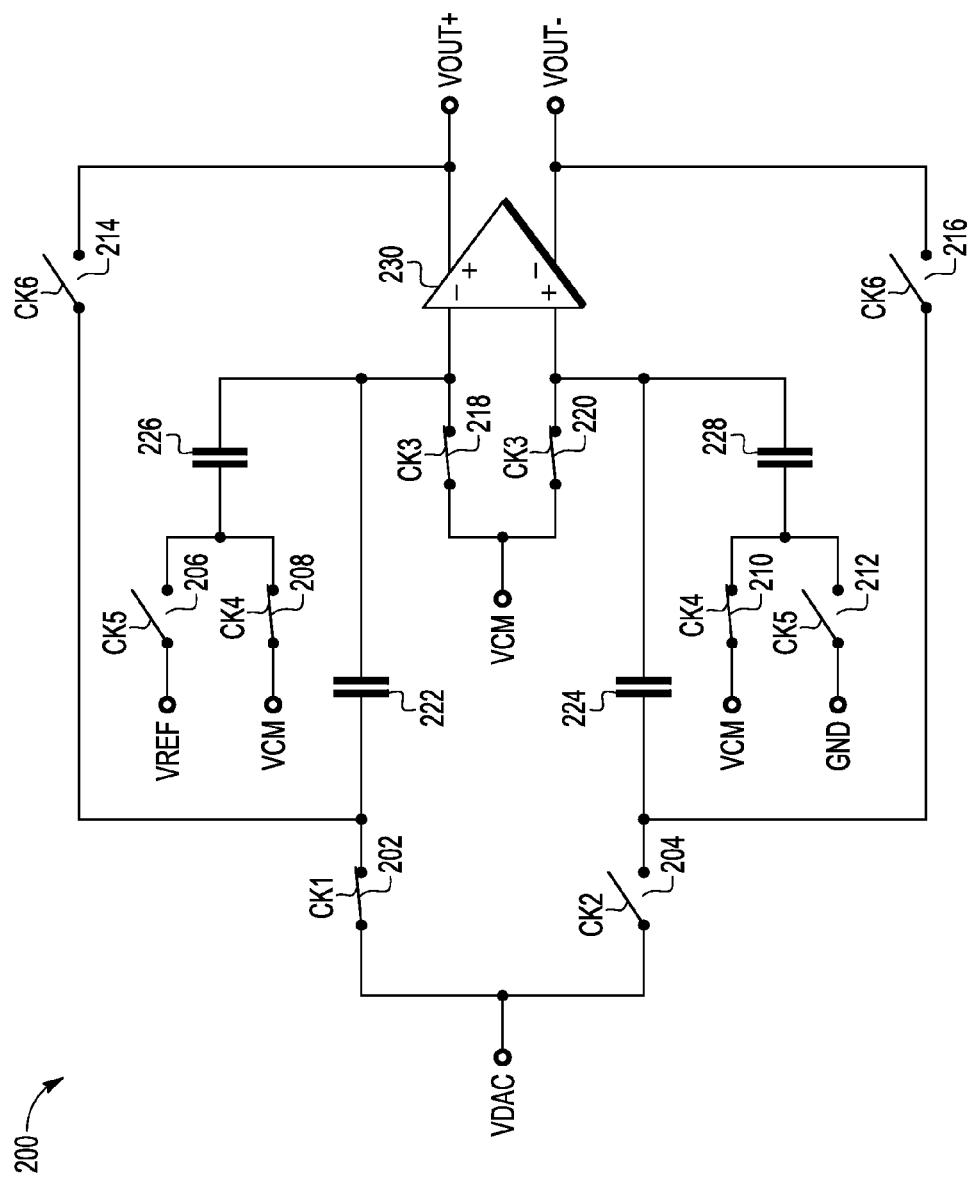

FIG. 3 illustrates circuitry of exemplary amplifier stage 200 at a first phase of operation according to an embodiment of the present disclosure. In the first phase, switches 202, 208, 210, 218, and 220 are closed or conductive. A clock pulse on the CK1 switch control signal, depicted as asserted or at a logic high level from time marker t3 through t4 in FIG. 7, causes switch 202 to close allowing a first test signal voltage at the VDAC terminal to be sampled onto capacitor 222. A logic level high on switch control signal CK3, depicted from t1 through t7 in FIG. 7, causes switches 218 and 220 to be closed allowing the voltage VCM to be provided to the second terminals of capacitors 222-228. Similarly, the switch control signal CK4, depicted as a logic level high from t2 through t9 in FIG. 7, causes switches 208 and 210 to be closed allowing the voltage VCM to be provided to the first terminal of capacitors 226 and 228.

Figure 4:
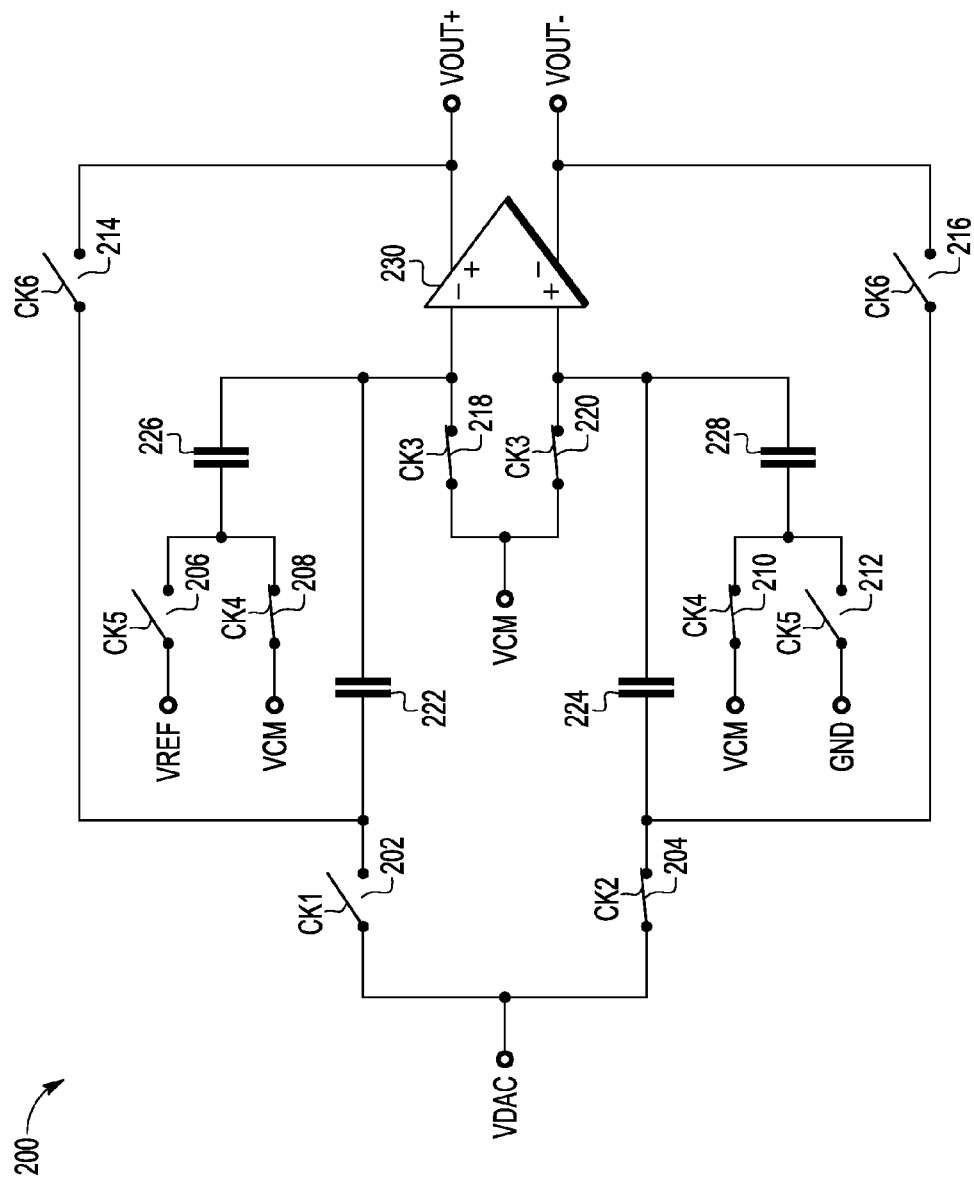

FIG. 4 illustrates circuitry of exemplary amplifier stage 200 at a second phase of operation according to an embodiment of the present disclosure. In the second phase, switches 204, 208, 210, 218, and 220 are closed or conductive. A clock pulse on the CK2 switch control signal, depicted as asserted or at a logic high level from t5 through t6 in FIG. 7, causes switch 204 to close allowing a second test signal voltage at the VDAC terminal to be sampled onto capacitor 224. In this embodiment, switch control signal CK2 is non-overlapping with switch control signal CK1. In some embodiments, the first and second test signals may mimic a full rail differential analog signal. Switches 218 and 220 continue to be closed for the duration of the CK3 clock pulse whereby the voltage VCM is provided to the second terminals of capacitors 222-228. Similarly, switches 208 and 210 continue to be closed for the duration of the CK4 clock pulse whereby the voltage VCM is provided to the first terminal of capacitors 226 and 228.

Figure 5:
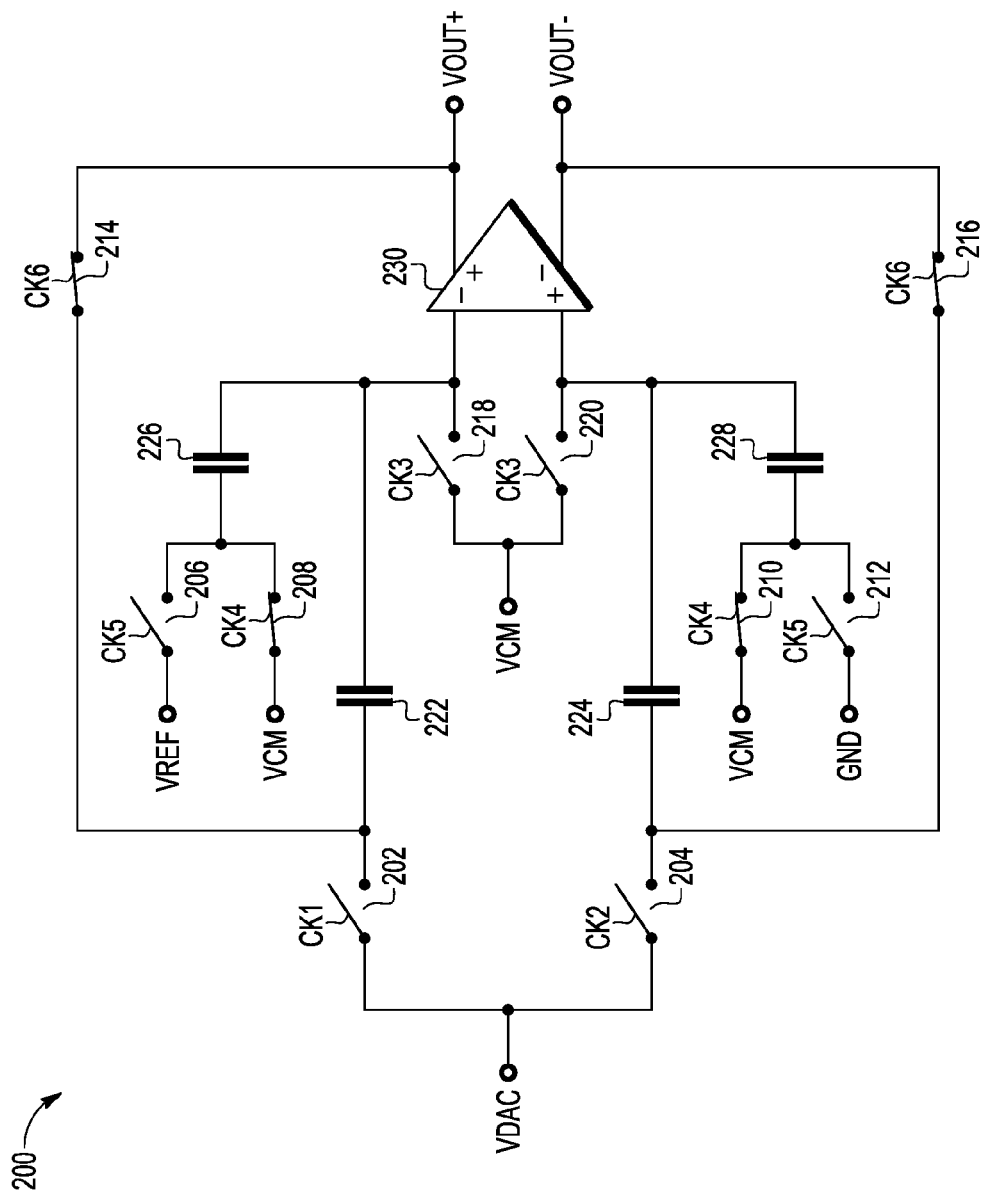

FIG. 5 illustrates circuitry of exemplary amplifier stage 200 at a third phase of operation according to an embodiment of the present disclosure. In the third phase, switches 208, 210, 214, and 216 are closed or conductive allowing amplification of the first and second test signals to generate amplified differential signals at the VOUT+ and VOUT− outputs of differential amplifier 230. A clock pulse on the CK6 switch control signal, depicted as asserted or at a logic high level from time marker t8 through t12 in FIG. 7, causes switches 214 and 216 to close allowing charge redistribution among capacitors 222 and 224 and outputs VOUT+ and VOUT− respectively. Output voltage VOUT+ may increase or decrease depending on the charge redistribution with capacitor 222 causing a change in voltage at the VOUT+ output terminal. Similarly, output voltage VOUT− may increase or decrease depending on the charge redistribution with capacitor 224 causing a change in voltage at the VOUT− output terminal. Switches 208 and 210 continue to be closed for the duration of the CK4 clock pulse whereby the voltage VCM is provided to the first terminal of capacitors 226 and 228.

Figure 6:
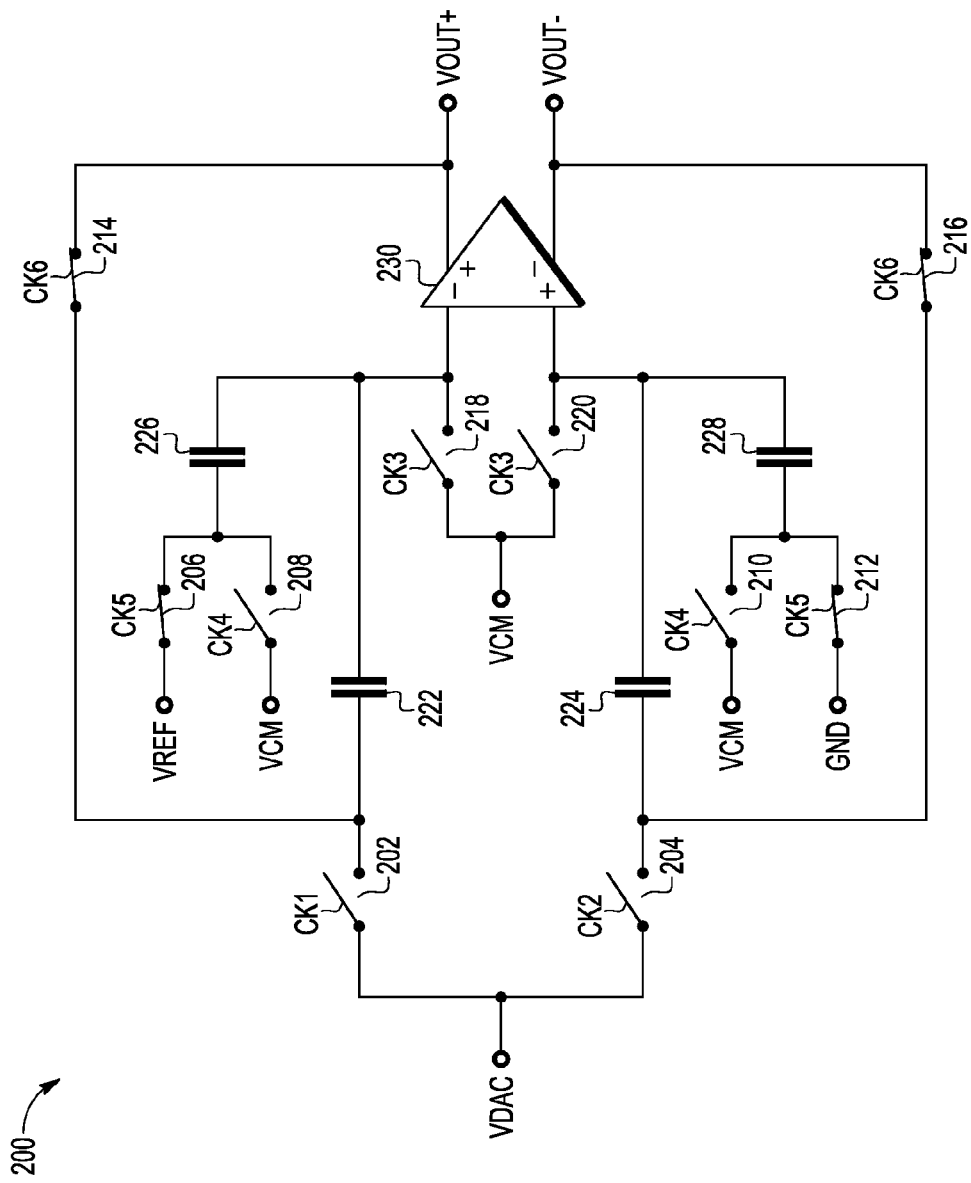

FIG. 6 illustrates circuitry of exemplary amplifier stage 200 at a fourth phase of operation according to an embodiment of the present disclosure. In the fourth phase, switches 206, 212, 214, and 216 are closed or conductive allowing amplification of the first and second test signals to generate amplified differential signals with an offset at the VOUT+ and VOUT− outputs of differential amplifier 230. A clock pulse on the CK5 switch control signal, depicted as asserted or at a logic high level from time marker t10 through t11 in FIG. 7, causes switches 206 and 212 to close providing a VREF voltage at the first terminal of capacitor 226 and a ground voltage on the first terminal of capacitor 228 respectively. Output voltage VOUT+ may increase or decrease depending on the charge redistribution with capacitor 222 causing an offset in voltage at the VOUT+ output terminal. Similarly, output voltage VOUT− may increase or decrease depending on the charge redistribution with capacitor 224 causing an offset in voltage at the VOUT− output terminal. Switches 214 and 216 continue to be closed for the duration of the CK6 clock pulse.

Generally, there is provided, a method for testing an analog-to-digital converter (ADC) including: coupling a single-ended output of an analog signal source to a differential input of an amplifier; coupling a differential output of the amplifier to a differential input of the ADC; alternately providing first and second test signals from the single-ended output of the analog signal source to first and second input terminals of the differential input of the amplifier; amplifying the first and second test signals to generate amplified differential signals at the differential output of the amplifier; providing the amplified differential signals to the differential input of the ADC; and determining if an output of the ADC is as expected. Determining if an output of the ADC is as expected may further include determining that one or more of an integral non-linearity, differential non-linearity, offset error, and a gain error of the output of the ADC is within a predetermined criteria. The method may further include coupling an offset voltage to the differential output of the amplifier after the step of alternately providing the first and second test signals to first and second input terminals of the differential input of the amplifier. Coupling the offset voltage may further include: providing a first offset voltage to a first output terminal of the differential output of the amplifier; and providing a second offset voltage different from the first offset voltage to a second terminal of the differential output. The analog signal source and the ADC may both be implemented on a single integrated circuit. Alternately providing first and second test signals may further include providing a ramped voltage to the differential input of the amplifier. The analog signal source may be a digital-to-analog converter (DAC). Alternately providing first and second test signals may further include coupling a common mode voltage to the first and second input terminals of the differential input of the amplifier concurrently with the alternately providing the first and second test signals. The first and second test signals may mimic a full rail differential analog signal.

In another embodiment, there is provided, a method for testing an analog-to-digital converter (ADC) including: coupling an output of an analog signal source to a differential input of an amplifier; coupling a differential output of the amplifier to a differential input of the ADC; providing a test signal from the output of the analog signal source to the differential input of the amplifier; coupling an offset voltage to the differential output of the amplifier; amplifying the test signal to generate an amplified and offset differential signal at the differential output of the amplifier; providing the amplified and offset differential signal to the differential input of the ADC; and determining if an output of the ADC is as expected. The output of the analog signal source may be characterized as being a single-ended output. The analog signal source and the ADC may both be implemented on a single integrated circuit. Providing a test signal from the output of the analog signal source to the differential input of the amplifier may further include alternately providing first and second test signals from the single-ended output of the analog signal source to first and second input terminals of the differential input of the amplifier. Providing first and second test signals further comprises providing a series of test codes to a digital-to-analog converter (DAC) as the analog signal source. The method may further include providing a common mode voltage to the differential input of the amplifier while alternately providing the first and second test signals.

In yet another embodiment, there is provided, a differential amplifier stage including: a single-ended input for being coupled to a single-ended output of a digital-to-analog converter (DAC); a first switch having a first terminal coupled to the single-ended input, and a second terminal; a first capacitor having a first terminal coupled to the second terminal of the first switch, and a second terminal; a second switch having a first terminal coupled to the single-ended input, and a second terminal; a second capacitor having a first terminal coupled to the second terminal of the second switch, and a second terminal; and a differential amplifier having a first differential input coupled to the second terminal of the first capacitor, and a second differential input coupled to the second terminal of the second capacitor. The differential amplifier may be characterized as being a unity gain amplifier. The differential amplifier may further include a differential output. The differential output of the differential amplifier stage may be for providing a test signal to a differential input of an analog-to-digital converter (ADC). A differential test signal for testing the ADC may be generated using the first and second switches and the single-ended output of the DAC.

By now it should be appreciated that there has been provided a method and system which accommodates testing of a differential analog-to-digital converter (ADC) using a single ended output of an analog signal source such as a digital-to-analog converter (DAC). An amplifier stage receives a single-ended output signal from the DAC based on test codes and provides differential output voltages to inputs of the differential ADC.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different processing systems. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for testing an analog-to-digital converter (ADC), the method comprising:
   coupling a single-ended output of an analog signal source to a differential input of an amplifier;
   coupling a differential output of the amplifier to a differential input of the ADC;
   alternately providing first and second test signals from the single-ended output of the analog signal source to first and second input terminals of the differential input of the amplifier;
   amplifying the first and second test signals to generate amplified differential signals at the differential output of the amplifier;
   providing the amplified differential signals to the differential input of the ADC; and
   determining if an output of the ADC is as expected.

2. The method of claim 1, wherein determining if an output of the ADC is as expected further comprises determining that one or more of an integral non-linearity, differential non-linearity, offset error, and a gain error of the output of the ADC is within a predetermined criteria.

3. The method of claim 1, further comprising coupling an offset voltage to the differential output of the amplifier after the step of alternately providing the first and second test signals to first and second input terminals of the differential input of the amplifier.

4. The method of claim 3, wherein coupling the offset voltage further comprises:
   providing a first offset voltage to a first output terminal of the differential output of the amplifier; and
   providing a second offset voltage different from the first offset voltage to a second terminal of the differential output.

5. The method of claim 1, wherein the analog signal source and the ADC are both implemented on a single integrated circuit.

6. The method of claim 1, wherein alternately providing first and second test signals further comprises providing a ramped voltage to the differential input of the amplifier.

7. The method of claim 1, wherein the analog signal source is a digital-to-analog converter (DAC).

8. The method of claim 1, wherein alternately providing first and second test signals further comprises coupling a common mode voltage to the first and second input terminals of the differential input of the amplifier concurrently with the alternately providing the first and second test signals.

9. The method of claim 1, wherein the first and second test signals mimic a full rail differential analog signal.

10. A method for testing an analog-to-digital converter (ADC), the method comprising:
   coupling an output of an analog signal source to a differential input of an amplifier;
   coupling a differential output of the amplifier to a differential input of the ADC;
   providing a test signal from the output of the analog signal source to the differential input of the amplifier;
   coupling an offset voltage to the differential output of the amplifier;
   amplifying the test signal to generate an amplified and offset differential signal at the differential output of the amplifier;
   providing the amplified and offset differential signal to the differential input of the ADC; and
   determining if an output of the ADC is as expected.

11. The method of claim 10, wherein the output of the analog signal source is characterized as being a single-ended output.

12. The method of claim 10, wherein the analog signal source and the ADC are both implemented on a single integrated circuit.

13. The method of claim 10, wherein providing a test signal from the output of the analog signal source to the differential input of the amplifier further comprises alternately providing first and second test signals from the single-ended output of the analog signal source to first and second input terminals of the differential input of the amplifier.

14. The method of claim 13, wherein providing first and second test signals further comprises providing a series of test codes to a digital-to-analog converter (DAC) as the analog signal source.

15. The method of claim 13, further comprising providing a common mode voltage to the differential input of the amplifier while alternately providing the first and second test signals.

16. A differential amplifier stage comprising:
a single-ended input for being coupled to a single-ended output of a digital-to-analog converter (DAC);
a first switch having a first terminal coupled to the single-ended input, and a second terminal;
a first capacitor having a first terminal coupled to the second terminal of the first switch, and a second terminal;
a second switch having a first terminal coupled to the single-ended input, and a second terminal;
a second capacitor having a first terminal coupled to the second terminal of the second switch, and a second terminal; and
a differential amplifier having a first differential input coupled to the second terminal of the first capacitor, and a second differential input coupled to the second terminal of the second capacitor.

17. The differential amplifier stage of claim 16, wherein the differential amplifier is characterized as being a unity gain amplifier.

18. The differential amplifier stage of claim 16, wherein the differential amplifier further comprises a differential output.

19. The differential amplifier stage of claim 18, wherein the differential output of the differential amplifier stage is for providing a test signal to a differential input of an analog-to-digital converter (ADC).

20. The differential amplifier stage of claim 19, wherein a differential test signal for testing the ADC is generated using the first and second switches and the single-ended output of the DAC.

* * * * *